United States Patent
Schiepp et al.

(10) Patent No.: US 10,381,954 B2
(45) Date of Patent: Aug. 13, 2019

(54) MSM ACTUATOR SYSTEM

(71) Applicant: ETO MAGNETIC GmbH, Stockach (DE)

(72) Inventors: Thomas Schiepp, Seitingen-Oberflacht (DE); Markus Laufenberg, Stockach (DE)

(73) Assignee: ETO MAGNETIC GmbH, Stockach (DE)

( * ) Notice: Subject to any disclaimer, the term of this patent is extended or adjusted under 35 U.S.C. 154(b) by 1200 days.

(21) Appl. No.: 14/460,836

(22) Filed: Aug. 15, 2014

(65) Prior Publication Data

US 2015/0054359 A1     Feb. 26, 2015

(30) Foreign Application Priority Data

Aug. 22, 2013  (DE) .................. 10 2013 109 108

(51) Int. Cl.
 *H02N 2/00* (2006.01)
 *H01L 41/12* (2006.01)
(52) U.S. Cl.
 CPC .............. *H02N 2/00* (2013.01); *H01L 41/12* (2013.01)
(58) Field of Classification Search
 CPC .. H01L 41/12; H01F 7/18; H01F 7/08; H02N 2/02
 USPC .......................................... 310/15, 26, 23–24
 See application file for complete search history.

(56) References Cited

U.S. PATENT DOCUMENTS

| 7,663,269 B2 * | 2/2010 | Laughlin | H02K 41/031 310/12.22 |
|---|---|---|---|
| 2006/0144472 A1 * | 7/2006 | Ullakko | B06B 1/045 148/104 |
| 2007/0127146 A1 * | 6/2007 | Moon | G02B 26/0833 359/871 |
| 2013/0002057 A1 | 1/2013 | Laufenberg et al. | |
| 2014/0091646 A1 * | 4/2014 | Schiepp | H01L 41/12 310/26 |

FOREIGN PATENT DOCUMENTS

| DE | 102010010801 A1 | 9/2011 | |
| GB | 2445773 A * | 7/2008 | ............ H01L 41/12 |

* cited by examiner

*Primary Examiner* — Quyen P Leung
*Assistant Examiner* — Leda T Pham
(74) *Attorney, Agent, or Firm* — Bachman & LaPointe, PC

(57) ABSTRACT

An MSM actuator system, comprising at least one expansion unit (22) having a magnetic shape memory material (MSM); coil means (27) for creating the magnetic flux; and flux-conducting means (10 to 16) made from a magnetically conductive material, the flux-conducting means constructed for enclosing by means of the coil means and magnetically flux-conducting contacting of the expansion unit by means of mutually opposite end sections (18, 20).

14 Claims, 3 Drawing Sheets

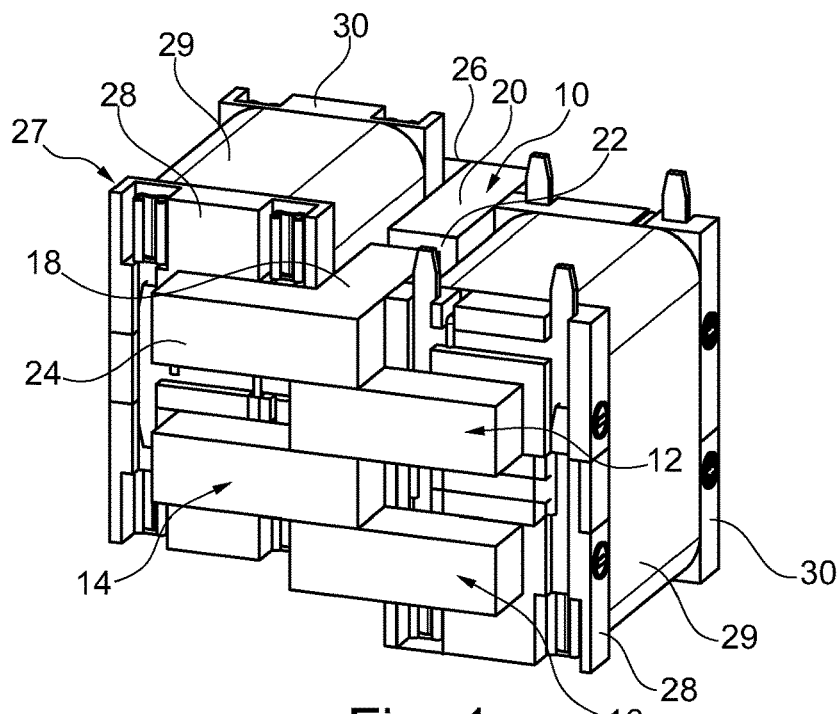
Fig. 1
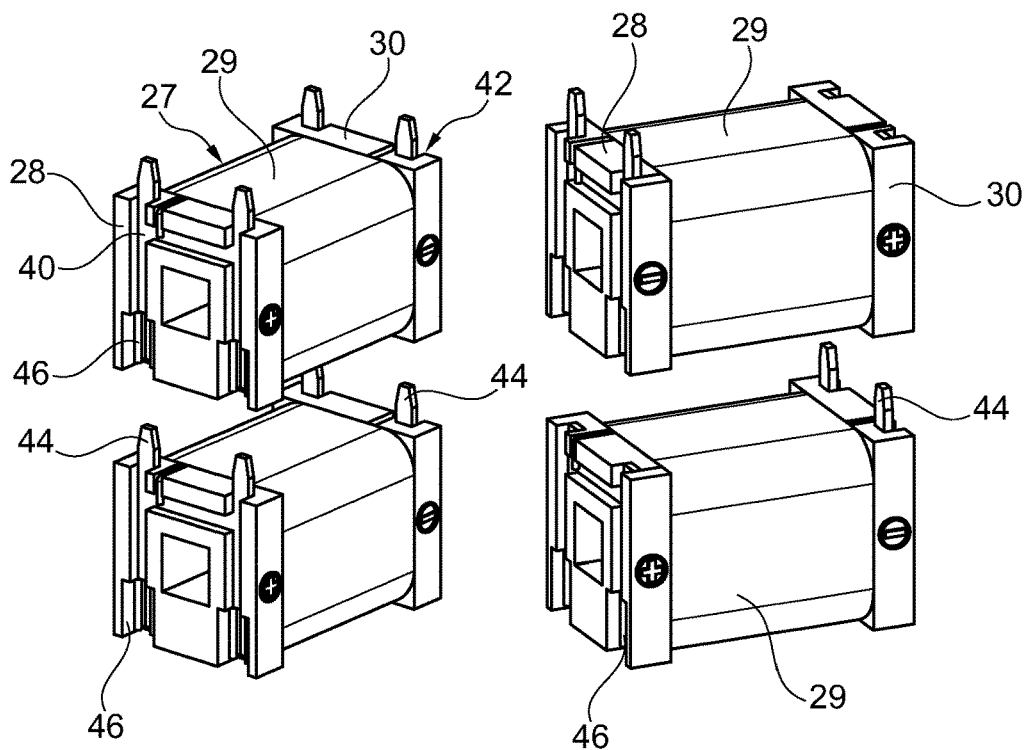
Fig. 2
Fig. 3

MSM ACTUATOR SYSTEM

BACKGROUND OF THE INVENTION

The present invention relates to an MSM actuator system.

It is assumed to be known per se from the prior art to use magnetic shape memory (MSM) alloy materials to realise actuators or similar control elements. Actually, actuators of this type exploit the effect that the shape memory material (also: shape memory alloy material) experiences an expansion as a reaction to an applied magnetic field and thereupon a control partner interacting with this expansion unit executes a corresponding control reaction. It is conventional in this context to assign coil means in the form of a coil device to the magnetic shape memory material of such an expansion unit, which coil device generates the magnetic field required for expanding the expansion unit as a reaction to a current feed. To instruct a typically elongated MSM body as expansion unit to execute the expansion movement along the longitudinal axis (an expansion hub is typically of the order of magnitude of approx. 5% of such a longitudinal extent), the contribution of a coil magnetic flux perpendicular thereto is necessary, which makes it necessary that the electromagnetic flux generated by the current feed of the coil means is brought to the expansion unit with the aid of magnetic-flux conduction means.

Design challenges relating to this are for example discussed in the applicant's DE 10 2010 010 801, technical solutions also being shown, so as to allow actuators of the presently discussed type to be realised as compactly as possible.

At the same time, MSM-based actuator technology also has economic disadvantages, not least owing to the discussed design conditions and the expensive MSM materials, compared to electromagnetic actuators for example, so that particularly with regards to a wider penetration of MSM actuator technology in the market, there is still a requirement for an increase in production and installation efficiency, particularly with regards to a multiplicity of different deployment contexts for such a control technology. In this respect, it has hitherto been the case that for a desired control purpose (that is to say for example a control hub to be provided with a control force to be achieved, in a geometric installation space) a concrete single solution with a suitably dimensioned MSM expansion unit and assigned coil and flux conduction means must be designed. Implementations for low-volume production are therefore often already uneconomical for these design reasons.

It is therefore the object of the present invention to create an SMS actuator system, which can easily be adapted to various control tasks or use contexts with little production, installation and implementation outlay, can be handled and extended universally and flexibly and equally has beneficial magnetic power development and control characteristics.

SUMMARY OF THE INVENTION

The object is achieved by means of the MSM actuator system with the features and advantageous developments of the invention described hereinbelow.

In a deviation from the case-by-case solutions assumed to form the generic type, which are each configured and set up in a manner specific to the use, a composite of components is suggested by the present invention in the manner of a modular assembly, primarily flux-conducting bows and coil carriers that can be assigned to the same, which can advantageously be stacked according to the invention (preferably, but not mandatory, so that magnetic flux conduction is enabled between adjacent flux-conducting bows) or are present in stacked form and thus the desired control properties can be created for a respective purpose by simple creation or dimensioning of the stack in terms of design and installation.

Actually, an arrangement is created by the present invention and the plurality of flux-conducting bows, which are provided thereby and can be stacked using the contact sections, which arrangement can be scaled almost as desired (namely in the thickness section of the respective flux-conducting bows), this stacking preferably being allowed in such a manner that the respective open shanks of the plurality of flux-conducting bows are constructed flush with one another and constructed as MSM crystal for parallel, joint and flux-conducting access to the (preferably common, one-piece) expansion unit. In this manner, an expansion unit with a necessary length to be contacted laterally for flux introduction can be selected for a respectively desired purpose and, in accordance with this dimension of extent, a required plurality of the flux-conducting bows are stacked in such a manner that the respective open shanks can contribute a coil magnetic flux, which is generated via a respective one of the windings assigned to the flux-conducting bows.

As, according to a preferred embodiment, the plurality of the flux-conducting bows are structured structurally identically, such an arrangement is not only exceptionally simple and flexible to use, the same (identical) components can be produced efficiently in high volume and cost effectively.

As, in the context of the invention, the respective flux-conducting bows preferably form constant cross sections, that is to say typically have a constant thickness over the course of the bow, the windings resting on an assigned winding section of the bow, which are furthermore preferably held in suitably configured and uniformly standardised coil carriers, generally determine the maximum thickness of a bow/winding combination. In the context of a preferred realisation of the invention, the stacking according to the invention is therefore realised by configuring and arranging the successive flux-conducting bows (with winding respectively resting thereon) along the stack in such a manner that respectively mutually directly adjacent flux-conducting bows have mutually opposite windings (with respect to the—common—expansion unit). This then leads to an advantageous consequence, that to achieve a stack of maximum thickness, the winding (preferably: the assigned coil carrier) can have a maximum double thickness relatively to the thickness of the flux-conducting bow (with respect to the stack direction in each case). In turn, this measure allows a particularly compact arrangement in the context of the assembly concept according to the invention.

Whilst the invention additionally particularly provides respective (in turn and further preferably mutually structurally identical) coil carriers (usually constructed as suitable injection-moulded parts or plastic mouldings) for respective flux-conducting bows, the invention in principle also comprises and provides for also directly considering the winding section of a flux-conducting bow as "coil carrier" in the context of the invention, in other words, to attach the winding to the flux-conducting bow at the site provided for the winding section directly within the scope of the invention.

As a result, the plurality of flux-conducting bows then generates a total flux using the respectively assigned winding and the magnetic flux contributions effected thereby, which total flux can be introduced along the stack direction (laterally) into the expansion unit and thus allows a flexible adaptation, dimensioning and configuration in the previously described manner.

In order to allow the stacking of the flux-conducting bows in both a mechanical and—preferably—a magnetically flux-conducting manner, it is preferred in the context of developments of the invention to provide these flux-conducting bows with a cross-sectional contour at least in the respective contact section (provided for stacking), which forms two mutually parallel sides; it is furthermore preferred to construct a rectangular cross section, which has advantages in terms of production, or can also be realised as a development by means of a plurality of flat elements, for example metal sheets, see below in this regard. In this case, "stacking" is principally to be understood as meaning any joining together of flux-conducting bows according to the invention, which creates a cohesive body along the stack direction without intermediate modules, wherein, as shown, although a magnetic flux conduction effect along this stack direction is beneficial, it is not compulsory for the functionality of the invention.

A particularly preferred and optimised embodiment of the invention provides not only constructing the coil carriers, which are advantageously provided for the winding and realised as separate bodies, as in turn respectively mutually identically configured components; it is additionally provided and advantageous in accordance with a development to configure these coil carriers with (double-pole) contacting for a winding respectively resting thereon in such a manner that a respectively desired interconnection of successive windings can take place (as a series or parallel circuit) simply by placing these coil carriers together or on top of one another. This variant can be realised particularly well, if this (double-pole) contacting is provided at or in the respective end-side flange sections of a coil carrier (or the respective carrier body) and ideally extends over or along the transverse direction of this flange, so that in the case of mutually adjacent carrier bodies, a continuous (logically double-pole) line can be created in this end-face region of the carrier bodies. If, in turn, these lines are provided redundantly and in such a manner that during installation or configuration, connections can be produced or interrupted in a targeted manner, a pre-selection of the desired wiring pattern between the adjacent coil carriers is possible easily and with low realisation and installation outlay.

A particularly elegant embodiment of the invention provides configuring the respective flux-conducting bows not in one piece (at least in terms of thickness or along the stack direction) or solidly (in certain sections), but rather alternatively to realise the flux-conducting bows themselves in turn as a suitable stack of flat elements, which in a particularly suitable manner can for example be sheet-metal elements, as can also be assumed to be known from the transformer context.

In a particularly beneficial manner, not only are eddy currents reduced, the circumstance for example that the transition surfaces between adjacent metal sheets or flat elements of such a stack within a respective flux-conducting bow have an increased resistance for magnetic flux means that an alignment or focussing of the magnetic flux takes place along the direction of extent of the sheet-metal elements and therefore generally along the conduction direction to the expansion element. The advantage of this technical development measure becomes apparent in particular with regards to the effect valid for MSM materials, that for maximum expansion action, the magnetic flux lines should be introduced as parallel to one another and perpendicularly to the entry surface as possible. The sheet-metal embodiment according to a development in particular therefore prevents not only the transfer of eddy currents between the sheet-metal layers, but also makes the passage of the magnetic field lines through the (typically magnetically resistive) separating layers harder, which can further preferably be modified further by means of paint or the like. As a result, this measure means that the magnetic circuit conducted by means of the flux-conducting bow becomes anisotropic, with field lines incident onto the MSM expansion element in an approximately aligned manner, which as a result leads to lower switching currents for the actuator system according to the invention.

A comparable effect in the context of further preferred developments of the invention can be achieved if, particularly in turn along the direction of extent of the expansion unit, a mutual engagement or interlacing of sections of the flux-conducting bow of adjacent or mutually opposite bows (with respect to the expansion unit) including associated windings is realised in the manner of a fan. Especially in the case of such a fanned development, it is therefore in particular also possible to realise a multiplicity of mutually adjacent individual contacts with respective flux inputs along a direction orthogonal to the expansion direction.

Preferred developments of the invention additionally provide for assigning permanently magnetic sections or permanent bodies to individual or a plurality of the flux-conducting bows, particularly to insert or attach the same in such a manner that the permanent magnetic flux of such a permanent magnet body (or permanent magnet section) can be brought to the MSM expansion element by means of the associated flux-conducting bow by means of the geometric construction thereof (such permanent-magnet flux-conducting bows typically having no winding resting thereon or no coil carrier, rather such a permanent magnetic element is preferably looped into the circuit of the flux-conducting bow in the region of the winding section). A particularly preferred embodiment of this technology provides that, due to the preferred permanent magnetic flux conduction via the contact section to an adjacent flux-conducting bow with winding provided there, the current feed thereof can have an active influence on the permanent magnet flux: This winding is unpowered, the permanent magnet flux carried by a permanent magnet flux-conducting bow is brought via the contact section to the winding section of the adjacent flux-conducting bow and short-circuited there; owing to the increased magnetic resistance of the MSM expansion element relatively thereto, only a reduced or no permanent-magnetic flux conduction input takes place here. If, by contrast, a current feed of the winding forces this permanent magnet flux through the winding section into the expansion element, the coil magnetic flux is increased by a contribution of the permanent magnet in this manner; smaller windings (and therefore in turn smaller dimensions of the overall arrangement) can therefore be realised by means of the assignment of permanent magnet flux-conducting bows.

To develop the modular or system concept upon which the invention is based, it is furthermore provided in accordance with a development that, as a variant for the disclosed structurally identical configuration of the plurality of flux-conducting bows, the same are dimensioned differently, particularly in such a manner that a spacing between the winding section and the pair of open shanks determined by the bow geometry is varied by configuring the intermediate flux-conducting connection region. This advantageously allows that, to further increase a compactness or packing density of an installed MSM system, the intermediate spaces of the flux-conducting bows between bows lying on top of one another (with respectively assigned coil carriers) can be used in an optimised manner.

Further possible configurations of the invention, which can be used in an isolated manner for the previously described developments, but also in any desired combination, lie for example in the material selection for the flux-conducting bows (both in a solid one-piece configuration and in sheet-metal form or in realisation by means of a stack of flat elements). Thus, for example, special magnet materials with reduced electrical conductance and at the same time, very good soft-magnetic properties (Vacoflux, manufactured by Vacuumschmelze, Hanau, Germany, is known for example) could be used for realising this magnetic circuit. Here also, the configuration of the flux-conducting bow can facilitate installation if necessary, for example such that a realisation by means of metal sheets stacked in turn allows latching or the like, additionally or alternatively spring or snapping effects can facilitate the installation.

Although it is also preferred in the context of the invention to construct the winding section according to the invention of the flux-conducting bows opposite the open shank pair in the context of the bow shape, in so far as the same is to be provided on a central shank of a C-shaped configuration of the flux-conducting bows, a coil carrier (or a plurality of coil carriers also distributed) can nonetheless be provided at other positions along the flux-conducting bow, just as the flux-conducting bow can, according to a development, also construct an E- or F-shaped base surface contour, in addition to a preferred C-shape. Also, developments of the invention provide to divide certain of these contours or configurations of the flux-conducting bows or configure the same so that they can be divided for installation in such a manner that, preferably in the region of the winding section, the installation can take place by means of plugging on both sides into a coil carrier or associated carrier body (which is typically closed on the jacket side).

The previously described variation of shank or section lengths in the context of the flux-conducting bows also applies for these configurations, thus these advantages are likewise realised in the case of E- or F-shaped base surface contours.

As a result, in a surprisingly elegant and simple manner, the present invention achieves the object set at the beginning, namely the creation of a flexibly installable and configurable system, which can be adapted to various use, control and context conditions, without an individual dimensioning and configuration of the modules having to take place; rather the present invention makes it possible to realise a respectively necessary configuration by means of suitable combination (stacking) of the flux-conducting bows with windings suitably provided thereon in each case.

BRIEF DESCRIPTION OF THE DRAWINGS

Further advantages, features and details of the invention result from the following description of preferred exemplary embodiments of the invention, as well as on the basis of the drawings. In the FIGS.

FIG. 1 shows a perspective view of the MSM actuator system of a first, preferred embodiment in an installed state with four stacked flux-conducting bows and respectively assigned coil carriers;

FIG. 2 and FIG. 3 show individual illustrations of respective pairs of coil carriers with end-face conductor structures provided for conductor structures;

DETAILED DESCRIPTION

Figure 4A:
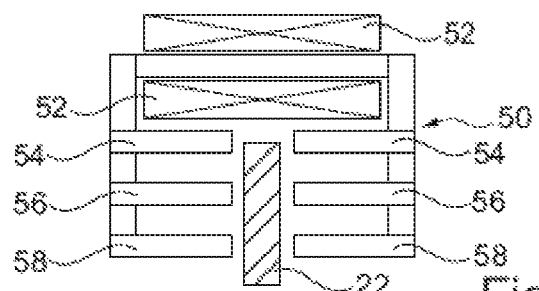
FIG. 4(a) to (c) show a variant of the invention with fanned flux-conducting bow structures.

FIG. 1 shows the installed state of a first embodiment of the MSM actuator system in a perspective view, here with four stacked, in each case roughly C-shaped flux-conducting bows 10, 12, 14, 16, these four bows being configured in each case structurally identically to one another with a square cross section, in each case having a pair of open shanks 18, 20 directed towards one another and act on an MSM expansion element 22, which in the figure extends vertically and can be expanded vertically, via free ends of these shanks so as to laterally input flux. Connecting sections 24, 26 in each case act on the open shanks 18, 20, which connecting sections enclose end flanges 28, 30 of a coil carrier 32 (made from a plastic injection-moulded part) between them in the configuration shown. A winding section of the flux-conducting bows 10 to 14, which are of constant (square here) cross section, is hidden in FIG. 1, which winding section connects the sections 24, 26 of a respective flux-conducting bow through the interior of the coil carrier 32.

The flux-conducting bows provided lying on top of one another or stacked, in the manner shown, touch at contact sections, which in the exemplary embodiment shown are formed by the respective shank faces 18, 20 at the transition to the respective connecting regions 24, 26; actually, these flat sides bear against one another in this region in such a manner that even in the stack direction (corresponding to the expansion direction and direction of extent of the expansion unit 22), a permanent magnet flux can occur (which is not necessary for the principal functionality of the invention however).

When feeding current to the windings shown, an electromagnetic flux input into the expansion element results due to input by means of the flux-conducting bows 10 to 16, which element correspondingly carries out an expansion movement in the vertical direction. As the exemplary embodiment clarifies, a large coil body, otherwise required in accordance with this expansion, and including a correspondingly large winding and widely dimensioned flux-conducting element is not required however; rather, this effect was realised by means of the system compiled in a modular manner and made up of (standardisable) individual components, which can in each case inherently be produced in a compact and simple manner, and as a whole create a homogeneous, arbitrarily scalable and expandable arrangement.

FIGS. 2 and 3 respectively show details of the coil configuration in FIG. 1. Thus, it initially becomes clear that each of the coil units 27 is realised in a structurally identical manner from a plastic moulding with the two end flanges 28, 30. Furthermore recognisable is the winding 29 sitting between these end flanges. This winding is contacted in each case at the end by means of conducting structures 40, 42, which construct contact projections 44 at one end and correspondingly configured contact fixture 46 in such a manner that in the manner that can be seen in FIG. 1 (for example in the right-hand region) continuous contacting can take place between adjacent coil units 27 sitting on top of one another.

Depending on polarity or contacting (the end flanges in FIG. 2 or FIG. 3 show polarity signs in this respect) an assignment or configuration can then take place, particularly also in that for example conductor tracks or conductor sections are removed, shortened, bent or brought out of engagement in another manner (FIG. 3 shows adaptations accordingly undertaken on the contacts). In particular, a respectively desired or necessary parallel or series circuit can be realised in this manner, depending on how flux production should actually take place for example in an arrangement of FIG. 1 or how respectively provided boundary conditions are configured. Thus, for example, in the case of comparatively high permitted voltages and small currents, it is rather a series circuit with high total resistance that is chosen for the coil arrangements, whilst in the case of lower voltage and higher permitted current, parallel circuits may be set up. In order to in turn take account of any inductive effects, a suitable configuration can likewise be chosen for influencing the switching times.

A preferred embodiment of the invention in each case provides for configuring the flux-conducting bows shown to be solid in FIG. 1 as a stack of suitable flat elements in turn, such as metal sheets.

Additionally or alternatively, it is in particular also conceivable to realise the fan-like design shown in the exemplary embodiments of FIGS. 4 to 6 described in the following.

Figure 4B:
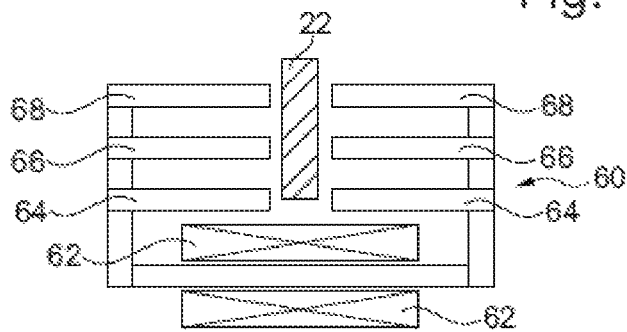
Figure 4C:
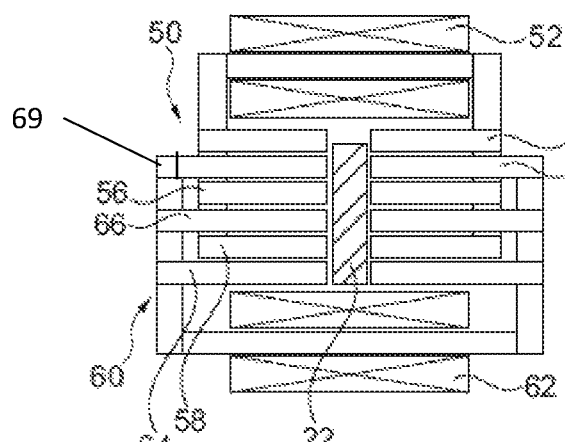
Figure 5:
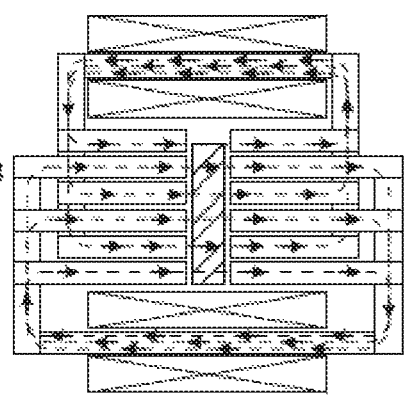
FIG. 5 shows a graph in accordance with FIG. 4(c) with schematically indicated flux curves.

Here, the respective flux-conducting bows 50 (FIG. 4(*a*)) or 60 (FIG. 4(*b*)) are configured in a fanned manner with respectively assigned winding (52 or 62) in the manner shown in interaction with the expansion unit 22, namely construct a plurality of open shank pairs 54, 56, 58 or 64, 66, 68. FIG. 4(*c*) shows the interleaving of these two flux-conducting bow arrangements configured as multiple layers of sheet metal. It becomes clear that in this manner, the entire relevant flux input surface for the expansion element 22 can be covered effectively in this manner using the interleaved, fanned layers. FIG. 5 clarifies, insofar as it is equivalent to FIG. 4(*c*), a typical flux behaviour in this arrangement; individual magnetic flux circuits can be seen, which advantageously leads to fewer deflections of the field lines within the material, compare the above discussion. FIG. 4(*c*) also shows one or more, in this case one, of the flux-conducting bows 68 has a permanent magnet body 69 inserted in such a manner that a permanent magnetic flux of the permanent magnet body flows to the expansion unit and is short-circuited by a winding section of one in the stack of adjacent flux-conducting bows when the winding is unpowered.

Figure 6:
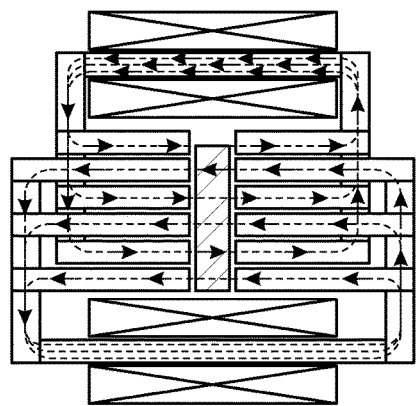
FIG. 6 shows a variant for FIG. 4(c) or FIG. 5 with oppositely poled current feed.

FIG. 6, which is structurally comparable with FIG. 4(*c*), clarifies yet another development of this approach. However, in this case, the coils 52 and 62 have different poles, which, in the case of the flux courses, leads to different flux directions in each layer. In the context of the invention, it has however become established that this does not have a disadvantageous effect on the expansion behaviour of the MSM element 22.

Figure 7:
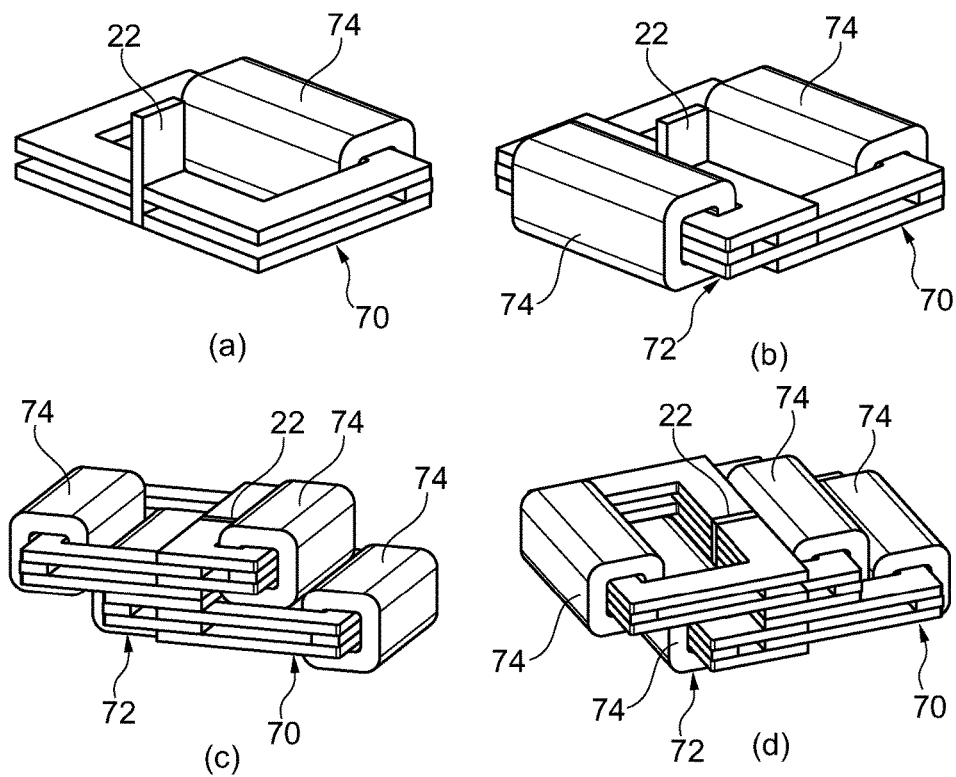
FIG. 7(a) to (d) show a variant of the invention in various stack states with geometric variations of the flux-conducting bows with respect to one another.

In (*a*) to (*d*), FIG. 7 clarifies, in installation stages of a further embodiment of the invention, how different dimensioning in the connecting region of a respective flux-conducting bow (in this respect in accordance with the lengths of sections 24, 26 in FIG. 1) lead to a further increased packing density. An individual fanned flux-conducting bow 70 made up of two layers is shown in FIG. 7(*a*) with an expansion body (22 sitting on the open shanks; FIG. 7(*b*) adds a second flux-conducting bow 72 with shortened connecting region thereto and likewise contacts the expansion element 22. FIGS. 7(*c*) and (*d*) respectively show additional combinations with further bows for achieving an overall fan arrangement, the varied connecting regions meaning that windings 74 of adjacent flux-conducting bows in each case project into open surfaces within a bow and thus can further increase the compactness.

The present invention is not limited to the exemplary embodiments shown; rather, the previously described exemplary embodiments are to be considered as merely exemplary and can also be varied as desired amongst themselves and also with features and aspects mentioned for the invention and the development thereof.

The invention claimed is:

1. An MSM actuator system, comprising:
at least one expansion unit (22) having a magnetic shape memory material (MSM) constructed for controlling interaction with an external control partner by executing an expansion movement as a reaction to an introduced magnetic flux;
coil means (27) for creating the magnetic flux, which is adapted to be switched and fed with current; and
flux-conducting means (10 to 16) made from a magnetically conductive material assigned to both the coil means and the at least one expansion unit, the flux-conducting means are constructed for magnetically flux-conducting contacting of the expansion unit by means of mutually opposite end sections (18, 20), wherein the flux-conducting means have a plurality of flux-conducting bows (10 to 16), which are structured structurally identically to one another and in each case have a winding section guidable through a winding (29) provided on a coil carrier of the coil means, a pair of opposite end sections (18, 20) as open shank of the respective flux-conducting bow and also a magnetically flux-conducting contact section for contacting an adjacent contact section of an adjacent flux-conducting bow, wherein the contact section allows at least one of a stacking of the plurality of flux-conducting bows along the direction of the expansion movement and a stacking of the plurality of flux-conducting bows by at least some of a plurality of contact sections.

2. The system according to claim 1, wherein the winding sections of the flux-conducting bows form a constant cross section and the winding has a maximum diameter, which is larger than a maximum diameter of the respective associated flux-conducting bow.

3. The system according to claim 1, wherein the contact section is adjacent to the pair of end sections, constructing a flat side, wherein by stacking the plurality of flux-conducting bows, the expansion unit for the plurality of flux-conducting bows is jointly loaded with respective magnetic flux contributions, wherein the coil carriers of successively adjacent flux-conducting bows lie opposite one another with respect to the expansion unit.

4. The system according to claim 1, wherein the flux-conducting bows have a cross-sectional contour with two mutually parallel flat sides to allow stacking, and the contact section is constructed in such a manner that stacking perpendicularly to the mutually parallel planes spanned by the respective flux-conducting bows.

5. The system according to claim 4, wherein in a stacked state of the plurality of identically constructed flux-conducting bows, respective winding sections of adjacent flux-conducting bows lie opposite one another with respect to the expansion unit and engage into a plurality of structured coil carriers.

6. The system according to claim 5, wherein the plurality of coil carriers in each case assigned to the plurality of flux-conducting bows has a housing dimension perpendicularly to a respective plane spanned by the flux-conducting bows such that in the stacked state along the stack direction, the coil carriers assigned to every second flux-conducting bow sits on or over one another.

7. The system according to claim 6, wherein the coil carriers are constructed in such a manner that in a stacked state, stacked on top of one another, the same offer a continuous double-pole contacting (40) for a respective winding (29) held on the coil carriers such that a joint current loading of the series or parallel circuit of the windings effected by the continuous double-pole contacting can take place.

8. The system according to claim 7, wherein the continuous double-pole contacting comprises at least one conductor extending along a respective one of the structurally identical carrier bodies, which has an encompassing and/or continuous end-face conduction in the case of adjacent carrier body of an adjacent coil carrier sitting at or on the same.

9. The system according to claim 4, wherein the flux-conducting bows are in each case comprised of a plurality of flux-conducting flat elements stacked in the respectively spanned plane.

10. The system according to claim 9, wherein the flat elements of a respective flux-conducting bow are offset with respect to one another and are stacked in such a manner that a fanned arrangement is created.

11. The system according to claim 10, wherein the flux-conducting bows are stacked in such a manner that the fanned arrangements of mutually adjacent and/or opposite flux-conducting bows engage into one another and form the flux-conducting contact section for the jointly assigned expansion unit.

12. The system according to claim 1, wherein the flux-conducting bows in each case form the same C-, E- or F-shaped base surface contour for each of the plurality of flux-conducting bows and/or are constructed such that they are divided in the plane spanned by a respective one of the flux-conducting bows into at least two part sections for assembly to give the final shape.

13. The system according to claim 1, wherein the plurality of flux-conducting bows are assigned coil carriers and one or more of the flux-conducting bows has a permanent magnet body inserted in such a manner that a permanent magnetic flux of the permanent magnet body flows to the expansion unit and is short-circuited by a winding section of one in the stack of adjacent flux-conducting bows when the winding is unpowered.

14. The system according to claim 1, wherein the plurality of flux-conducting bows (70, 72) present as a stack, adjacent flux-conducting bows form different length dimensions in a regularly alternating manner along a stack direction in a connecting section between the respective winding sections and the respective open shanks.

\* \* \* \* \*